(12) United States Patent
Yang et al.

(10) Patent No.: US 6,504,763 B1
(45) Date of Patent: Jan. 7, 2003

(54) NONVOLATILE SEMICONDUCTOR MEMORY CAPABLE OF RANDOM PROGRAMMING

(75) Inventors: Ching-Sung Yang, Chang-Hua Hsien (TW); Shih-Jye Shen, Hsin-Chu (TW); Ching-Hsiang Hsu, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 09/683,845

(22) Filed: Feb. 21, 2002

(51) Int. Cl.$^7$ .............................................. G11C 16/04
(52) U.S. Cl. ..................... 365/185.28; 365/185.17; 365/185.29; 365/185.18; 257/316
(58) Field of Search ................ 365/185.17, 185.28, 365/185.29, 185.33, 185.18; 257/316; 438/257

(56) References Cited

U.S. PATENT DOCUMENTS 6,295,227 B1 * 9/2001 Sakui et al. ............ 365/185.17

6,400,604 B2 * 6/2002 Noda ..................... 365/185.12

* cited by examiner

*Primary Examiner*—Son Mai
(74) *Attorney, Agent, or Firm*—Winston Hsu (57) ABSTRACT

A nonvolatile semiconductor memory capable of random programming has a semiconductor substrate of a first conductivity type having a memory region, a deep ion well of a second conductivity type located in the semiconductor substrate within the memory region, a shallow ion well of the first conductivity type isolated by an STI layer within the deep ion well, at least one NAND cell block located on the semiconductor substrate within the shallow ion well, and a bit line located over the semiconductor substrate used to provide a first predetermined voltage for the shallow ion well during a data program mode via a conductive plug which electrically connects to the bit line and extends downward to the shallow ion well. Consequently, during a programming operation, only a selected word line is required to have an appropriate voltage applied to it. Thus, the power needed is reduced and access time is shortened.

14 Claims, 7 Drawing Sheets

|  | ST | STx | WL | WLx | BL | SL |
|---|---|---|---|---|---|---|
| Data program mode | 0V | 0V | -10V | 0V | 5V | Floating |
| Data erase mode | 0V | 0V | 10V | 10V | Floating | -10V |
| Data read mode | 5V | 0V | 0V | 5V | 0V | 1-5V |

Fig. 6

|  | ST | STx | WL | WLx | BL | SL |
|---|---|---|---|---|---|---|
| Data program mode | 0V | 0V | -5V | 0V | 5V | Floating |
| Data erase mode | 0V | 0V | 5V | 5V | Floating | -5V |
| Data read mode | 5V | 0V | 0V | 5V | 0V | 1-5V |

Fig. 7

NONVOLATILE SEMICONDUCTOR MEMORY CAPABLE OF RANDOM PROGRAMMING

BACKGROUND OF THE INVENTION

1. Field of the Invention

The present invention relates to a nonvolatile semiconductor memory, and more particularly, to a NAND type nonvolatile semiconductor memory capable of random programming.

2. Description of the Prior Art

Recently, flash electrically erasable programmable read-only memories (EEPROMs) have gained substantial interest as the best solution for electrically rewritable high-density nonvolatile data storage. These semiconductor memories combine the high integration density and the high programming speed of EPROMs with the higher functionality of EEPROMs by offering electrical in-circuit erasability. Typically, flash memory includes both NOR cell and NAND cell types.

At first, the flash memory was introduced to replace program code EPROMs and battery-backed Random Access Memories (RAMs) in measuring equipment for calibration and data storage, and in microcomputers for micro-code updates.

Nowadays, new applications have arisen such as solid-state disks for small computers and Personal Digital Assistants (PDAs), program storage for portable equipment, and smart cards. The NAND cell type flash memory is especially widely utilized in various fields. Furthermore, the operational mechanism of many commercially available flash EEPROM devices can be divided into several classes. One class of flash EEPROMs uses a bi-directional Fowler-Nordheim (FN) tunneling mechanism to function.

Figure 1:
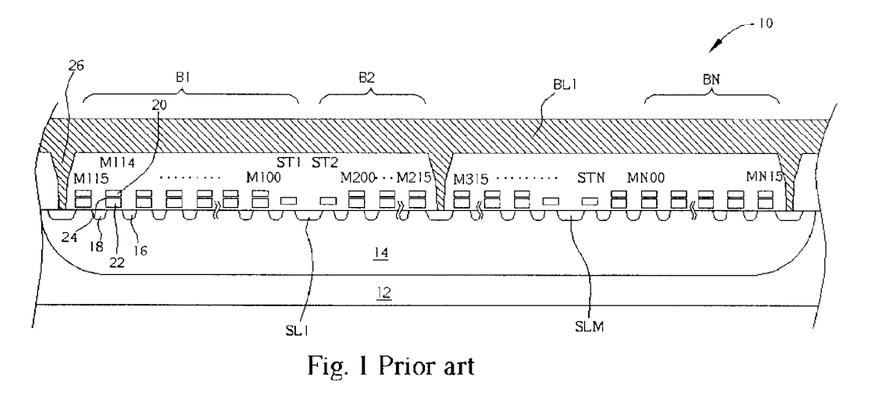
FIG. 1 is a cross-sectional view illustrating a NAND type EEPROM according to the prior art.

Please refer to FIG. 1. FIG. 1 is a cross-sectional view illustrating a conventional NAND type EEPROM 10. As shown in FIG. 1, the NAND type EEPROM 10 comprises a semiconductor substrate 12 having a memory region, a semiconductor well 14 located in the semiconductor substrate 12 within the memory region, a plurality of NAND cell blocks B located on the semiconductor substrate 12 within the semiconductor well 14, and a bit line BL1 located over the semiconductor substrate 12.

Furthermore, the NAND cell block B comprises a plurality of rewritable memory cell transistors M connected in series along a direction of the bit line BL1. Meanwhile, adjacent memory cell transistors M underneath the same bit line BL1 share diffusion regions in the semiconductor well 14 as their sources and drains so as to constitute a NAND cell. For example, a memory cell transistor M114 utilizes a diffusion region 16 as its source and a diffusion region 18 as its drain. Simultaneously, the diffusion region 18 is the source of a memory cell transistor M115 as well.

Additionally, the memory cell transistor M has a stacked gate structure. For instance, the memory cell transistor M114 has a floating gate 22 for storing charge, an insulator film 24, and a control gate 20 which are stacked up on the semiconductor well 14. Moreover, a selecting transistor ST is located at one end of the series array of rewritable memory cell transistors M and is electrically connected to a source line SL. In addition, a plug 26 is located at the other end of the series array of rewritable memory cell transistors M and is electrically connected to the bit line BL1. At the same time, the control gate 20 of the memory cell transistor M is electrically connected to a word line perpendicular to the bit line BL1. Thus, the series array of memory cell transistors M driven by the same word line defines one NAND cell block B.

For the prior art NAND type EEPROM 10, a programming operation is carried out by applying a high voltage such as 20V to a selected word line. Meanwhile, a rather high voltage such as 12V is applied to unselected word lines to conduct a channel. Consequently, the prior art NAND type EEPROM 10 has very high power consumption. In addition, since each of the word lines are required to have high voltages applied to them, the programming speed is decelerated and corresponding reliability problems such as junction breakdown will occur.

SUMMARY OF INVENTION

It is therefore a primary objective of the claimed invention to provide a NAND type nonvolatile semiconductor memory capable of random programming to solve the above-mentioned problems.

According to the claimed invention, a nonvolatile semiconductor memory capable of random programming comprises a semiconductor substrate of a first conductivity type having a memory region, a deep ion well of a second conductivity type located in the semiconductor substrate within the memory region, a shallow ion well of the first conductivity type isolated by an STI layer within the deep ion well, at least one NAND cell block located on the semiconductor substrate within the shallow ion well, and a bit line located over the semiconductor substrate used to provide a first predetermined voltage for the shallow ion well during a data program mode and provide a second predetermined voltage for the shallow ion well during a data erase mode via a conductive plug which electrically connects to the bit line and extends downward to the shallow ion well.

It is an advantage of the claimed invention that a nonvolatile semiconductor memory comprises a shallow ion well within a deep ion well, and a conductive plug which extends downward to the shallow ion well to be a common electrode, so that requirement of applying high voltages to each word line is unnecessary during a programming operation. That is, according to the claimed invention nonvolatile semiconductor memory, during a programming operation, only a selected word line is required to have an appropriate voltage applied to it. Thus, the power needed is substantially reduced and the access time is shortened. Consequently, the performance of the nonvolatile semiconductor memory is significantly improved.

These and other objectives of the claimed invention will no doubt become obvious to those of ordinary skill in the art after reading the following detailed description of the preferred embodiment that is illustrated in the various figures and drawings.

DETAILED DESCRIPTION

Figure 2:
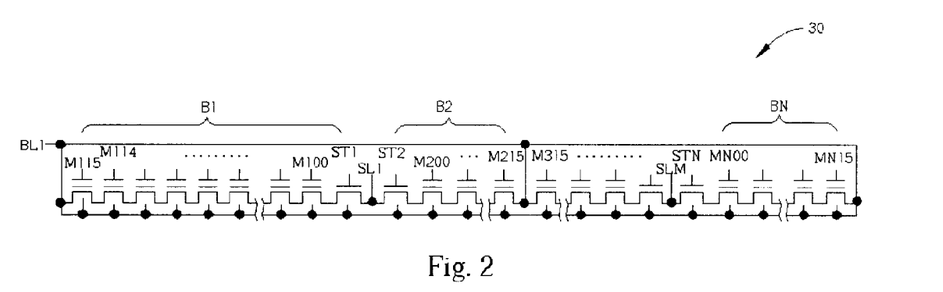
FIG. 2 is an equivalent circuit diagram of a NAND type nonvolatile semiconductor memory according to the present invention.

Please refer to FIG. 2. FIG. 2 is an equivalent circuit diagram of a NAND type nonvolatile semiconductor memory 30 according to the present invention. A NAND cell block B comprises a plurality of rewritable memory cell transistors M connected in series along a direction of a bit line BL1. Meanwhile, a selecting transistor ST is located at one end of the series array of rewritable memory cell transistors M and is electrically connected to a source line SL, while the other end of the series array of rewritable memory cell transistors M is electrically connected to the bit line BL1.

Figure 3:
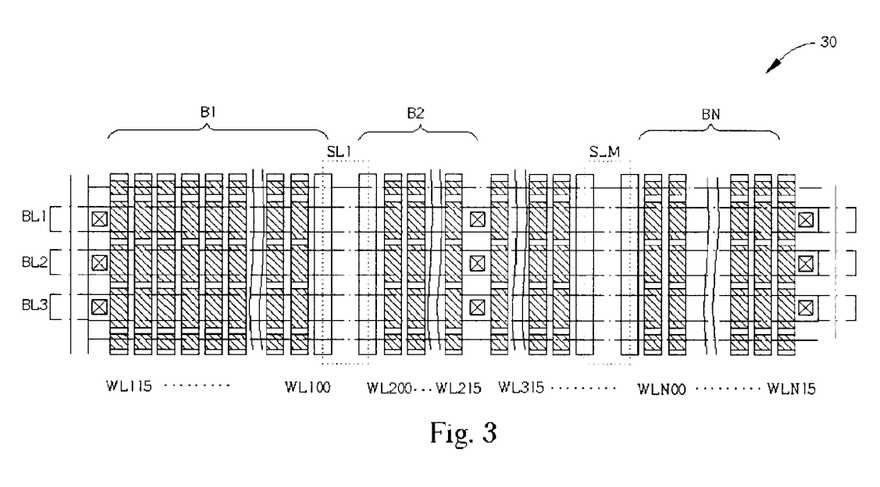
FIG. 3 is a schematic diagram illustrating a layout of a NAND type nonvolatile semiconductor memory according to the present invention.
Figure 4:
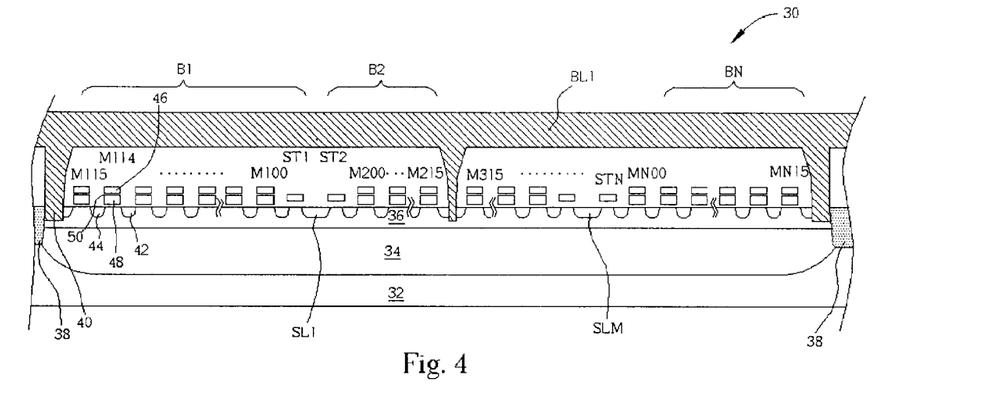
FIG. 4 is a cross-sectional view of the NAND type nonvolatile semiconductor memory along a bit line shown in FIG. 3.

Please refer to FIGS. 3 and 4. FIG. 3 is a schematic diagram illustrating a layout of the NAND type nonvolatile semiconductor memory 30 according to the present invention. FIG. 4 is a cross-sectional view of the NAND type nonvolatile semiconductor memory 30 along the bit line BL1 shown in FIG. 3. As shown in FIGS. 3 and 4, the NAND type nonvolatile semiconductor memory 30 comprises a semiconductor substrate 32 of a first conductivity type having a memory region, a deep ion well 34 of a second conductivity type located in the semiconductor substrate 32 within the memory region, a shallow ion well 36 of the first conductivity type isolated by an STI layer 38 within the deep ion well 34, the plurality of NAND cell blocks B located on the semiconductor substrate 32 within the shallow ion well 36, and the bit line BL located over the semiconductor substrate 32 used to provide a first predetermined voltage for the shallow ion well 36 during a data program mode and provide a second predetermined voltage for the shallow ion well 36 during a data erase mode via a conductive plug 40 which electrically connects to the bit line BL1 and extends downward to the shallow ion well 36.

According to a preferred embodiment of the present invention, the first conductivity type is P type and the second conductivity type is N type. That is, the semiconductor substrate 32 is a P type semiconductor substrate, and the deep ion well 34 is N conductivity type, and then the shallow ion well 36 is P conductivity type. Surely, an N type semiconductor substrate can be used as the semiconductor substrate 32 of the present invention as well. Meanwhile, the deep ion well 34 is P conductivity type and the shallow ion well 36 is N conductivity type. Additionally, the STI layer 38 has a thickness greater than a well depth of the shallow ion well 36. In this preferred embodiment, the STI layer 38 has a thickness between 3000 to 4000 Å The doping dose of the deep ion well 34 is approximately between 1E12 to 1E13 atoms/m², and the doping dose of the shallow ion well 36 is approximately between 1E13 to 1E14 atoms/m².

Additionally, the NAND cell block B comprises a plurality of rewritable memory cell transistors M connected in series along a direction of the bit line BL1. Meanwhile, adjacent memory cell transistors M underneath the same bit line BL1 share diffusion regions in the shallow ion well 36 to be their sources and drains so as to constitute a NAND cell. For example, a memory cell transistor M114 utilizes a diffusion region 42 as its source, and a diffusion region 44 as its drain. Simultaneously, the diffusion region 44 is the source of a memory cell transistor M115 as well.

According to a preferred embodiment of the present invention, the memory cell transistor M has a stacked gate structure. For instance, the memory cell transistor M114 has a floating gate 48 for storing charge, an insulator film 50, and a control gate 46 which are stacked up on the shallow ion well 36. The insulator film 50 may be an oxide-nitride-oxide (ONO) film. Surely, the memory cell transistor M of the present invention may be a SONOS memory cell composed of an ONO layer on the shallow ion well 36 and a polysilicon layer on the ONO layer for using as the control gate 46. Furthermore, each of the control gates of the memory cell transistors M perpendicular to the bit line BL electrically connect to the corresponding word lines WL. Therefore, the series array of memory cell transistors M driven by the same word line defines one NAND cell block B.

Figure 5:
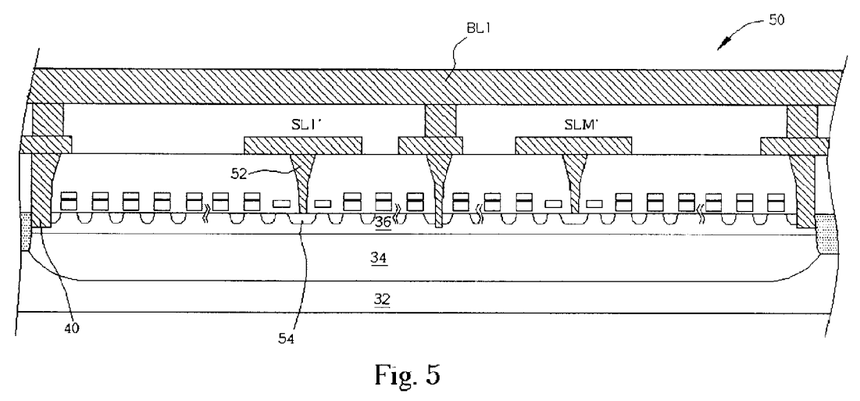
FIG. 5 is a cross-sectional view of a NAND type nonvolatile semiconductor memory according to an alternative embodiment of the present invention.

Moreover, one end of the series array of memory cell transistors M is electrically connected to the bit line BL via the plug 40. For extending the plug 40 to the shallow ion well 36, the contact hole is first etched to expose the surface of the shallow ion well 36, then penetrated through the drain of the memory cell transistor M, and finally etched vertically downward to the shallow ion well 36. Please refer to FIG. 5. FIG. 5 is a cross-sectional view of a NAND type nonvolatile semiconductor memory 50 according to an alternative embodiment of the present invention. Except for the buried heavy doping region SL1 shown in the nonvolatile semiconductor memory 30, the source line SL can also be a metal wiring SL1" shown in the nonvolatile semiconductor memory 50 to connect to the diffusion region 54 via the plug 52.

Figure 6:
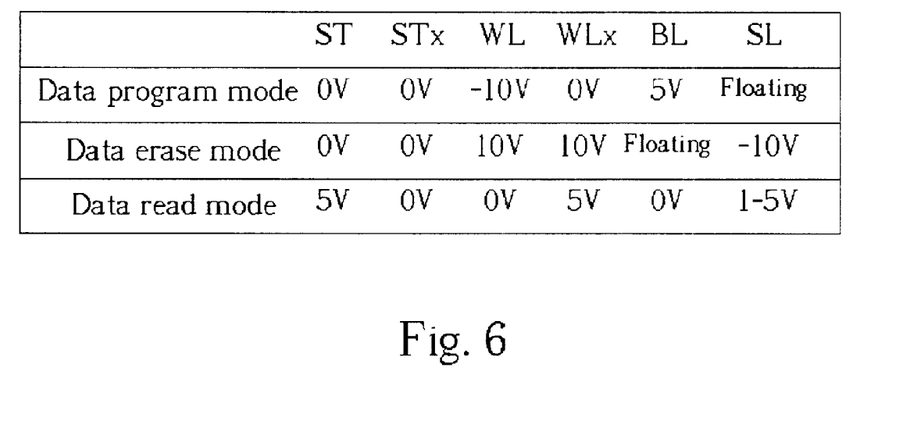
FIG. 6 is a table illustrating operational conditions of a NAND type nonvolatile semiconductor memory with a stacked gate structure according to the present invention.

FIG. 6 is a table illustrating the operational conditions of a NAND type nonvolatile semiconductor memory with a stacked gate structure according to the present invention. As shown in FIG. 6 and taking the nonvolatile semiconductor memory 30 as an example, during a data program mode, a voltage such as 5V is applied to the bit line BL. Since the bit line BL is electrically connected to the shallow ion well 36 via the plug 40, which extends to the shallow ion well 36, the voltage of 5V is also applied to the shallow ion well 36, thus regarding the shallow ion well 36 as a common electrode in the present invention. As a result, during the data program mode, only a selected word line WL is applied with an appropriate voltage to induce a Fowler-Nordheim (FN) tunneling mechanism, thereby completing the programming operation. In the preferred embodiment of the present invention, the selected word line WL is applied with a voltage of −10V, and the source line is floating. A gate voltage of the selecting transistor ST is 0V.

During a data erase mode, a voltage such as −10V is applied to the source line SL of the nonvolatile semiconductor memory 30. Since the data erase mode erases all of the memory cell transistors M simultaneously, all of the word lines WL are applied with a voltage of 10V to induce an FN tunneling mechanism. Likewise, the bit line BL is floating, and the gate voltage of the selecting transistor ST is 0V. That is, the nonvolatile semiconductor memory 30 utilizes the bi-directional FN tunneling mechanism to function.

During a data read mode, a voltage such as 0V is applied to the bit line BL of the nonvolatile semiconductor memory 30. Meanwhile, a gate of a selected selecting transistor ST is applied with a voltage of 5V, and gates of unselected selecting transistor STx are applied with a voltage of 0V.

Furthermore, unselected word lines WLx are applied with a voltage of 5V, and a selected word lines WL is applied with a voltage of 0V, and a source line SL is applied with a voltage between 1 to 5V.

Figure 7:
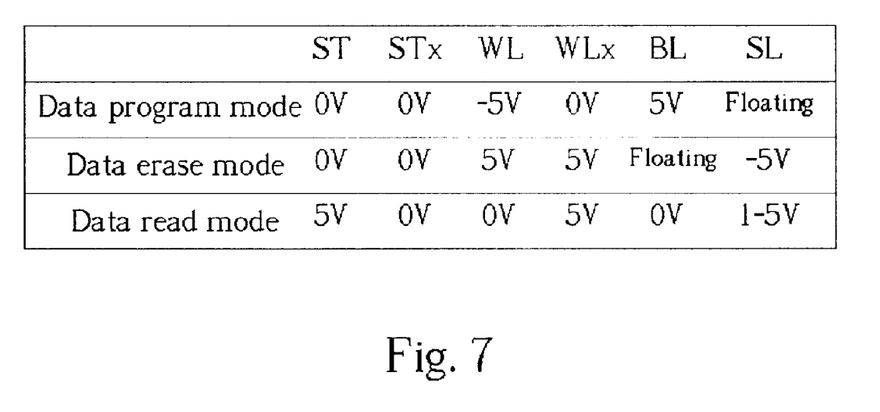
FIG. 7 is a table illustrating the operational conditions of a NAND type nonvolatile semiconductor memory with SONOS memory cells according to the present invention.

As described previously, except for the stacked gate structure, the nonvolatile semiconductor memory of the present invention may be composed of the SONOS memory cells. FIG. 7 is a table illustrating the operational conditions of a NAND type nonvolatile semiconductor memory with SONOS memory cells according to the present invention. As shown in FIG. 7, during a data program and a data erase modes, voltages applied to the nonvolatile semiconductor memory with the SONOS memory cells are lower than the voltages applied to the nonvolatile semiconductor memory with the stacked gate structure. That is, the nonvolatile semiconductor memory composed of the SONOS memory cells not only has an easier manufacturing process but also consumes less power.

In contrast to the prior art, the present invention provides a nonvolatile semiconductor memory comprising a shallow ion well within a deep ion well, and a conductive plug that extends downward to the shallow ion well to be a common electrode. Therefore, requirement of applying high voltages to each word line is unnecessary during a programming operation. That is, according to the present invention nonvolatile semiconductor memory, during a data program mode, only a selected word line is required to be applied with an appropriate voltage. Thus, the power needed is substantially reduced and the access time is shortened. Consequently, the performance of the nonvolatile semiconductor memory is significantly improved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A nonvolatile semiconductor memory capable of random programming comprising:

a semiconductor substrate of a first conductivity type having a memory region;

a deep ion well of a second conductivity type located in the semiconductor substrate within the memory region;

a shallow ion well of the first conductivity type isolated by an STI layer within the deep ion well, wherein the STI layer has a thickness greater than well depth of the shallow ion well;

at least one NAND cell block located on the semiconductor substrate within the shallow ion well; and a bit line located over the semiconductor substrate used to provide a first predetermined voltage for the shallow ion well during a data program mode via a conductive plug which electrically connects to the bit line and extends downward to the shallow ion well.

2. The nonvolatile semiconductor memory of claim 1, wherein the first conductivity type is P type and the second conductivity type is N type.

3. The nonvolatile semiconductor memory of claim 1, wherein the NAND cell block comprises a series array of rewritable memory cell transistors and a selecting transistor located at one end of the series array of rewritable memory cell transistors while the plug is located at the other end of the series array of rewritable memory cell transistors.

4. The nonvolatile semiconductor memory of claim 3, wherein the selecting transistor is electrically connected to a source line.

5. The nonvolatile semiconductor memory of claim 3, wherein each of the rewritable memory cell transistors comprises a stacked gate structure.

6. The nonvolatile semiconductor memory of claim 3, wherein the rewritable memory cell transistor is a SONOS memory cell.

7. An erasable programmable read-only memory (EPROM) comprising:

a semiconductor substrate having a memory region;

a shallow well formed in the memory region and isolated by an STI layer having a thickness greater than well depth of the shallow ion well;

a deep well formed in the memory region below the shallow well;

a plurality of NAND cell blocks formed in the shallow well on the semiconductor substrate; and at least one bit line provided over the semiconductor substrate which electrically connects to the shallow well via a conductive plug extending downward to the shallow well.

8. The EPROM of claim 7, wherein the bit line provides a bit line voltage for the shallow well during a data program mode and is floating during a data erase mode.

9. The EPROM of claim 8, wherein the data program mode is implemented by means of Fowler-Nordheim (FN) tunneling mechanism.

10. The EPROM of claim 8, wherein the bit line voltage is 5V.

11. The EPROM of claim 7, wherein each of the NAND cell blocks comprises a series array of rewritable memory cell transistors and a selecting transistor located at one end of the series array of rewritable memory cell transistors.

12. The EPROM of claim 11, wherein the selecting transistor is electrically connected to a source line.

13. The EPROM of claim 11, wherein each of the rewritable memory cell transistors comprises a stacked gate structure.

14. The EPROM of claim 11, wherein the rewritable memory cell transistor is a SONOS memory cell.

* * * * *